US008795431B2

(12) United States Patent
Imai et al.

(10) Patent No.: US 8,795,431 B2
(45) Date of Patent: Aug. 5, 2014

(54) METHOD FOR PRODUCING GALLIUM NITRIDE LAYER AND SEED CRYSTAL SUBSTRATE USED IN SAME

(71) Applicant: NGK Insulators, Ltd., Aichi-prefecture (JP)

(72) Inventors: Katsuhiro Imai, Nagoya (JP); Makota Iwai, Kasugai (JP); Takanao Shimodaira, Nagoya (JP); Masahiro Sakai, Nagoya (JP); Shuhei Higashihara, Nagoya (JP); Takayuki Hirao, Nagoya (JP)

(73) Assignee: NGK Insulators, Ltd., Aichi-prefeccture (JP)

( * ) Notice: Subject to any disclaimer, the term of this patent is extended or adjusted under 35 U.S.C. 154(b) by 0 days.

(21) Appl. No.: 14/032,297

(22) Filed: Sep. 20, 2013

(65) Prior Publication Data

US 2014/0014028 A1   Jan. 16, 2014

Related U.S. Application Data

(63) Continuation of application No. PCT/JP2012/057662, filed on Mar. 16, 2012.

(30) Foreign Application Priority Data

Mar. 22, 2011   (JP) ................................. 2011-062059

(51) Int. Cl.
*C30B 21/02* (2006.01)

(52) U.S. Cl.
USPC ................. 117/84; 117/88; 117/90; 117/103; 117/104; 117/923

(58) Field of Classification Search
USPC .................. 117/84, 88, 90, 103, 104, 923
See application file for complete search history.

(56) References Cited

U.S. PATENT DOCUMENTS 5,310,446 A * 5/1994 Konishi et al. .................. 117/58
6,036,773 A * 3/2000 Wang et al. ..................... 117/97
(Continued)

FOREIGN PATENT DOCUMENTS

JP   2003-163370 A   6/2003
JP   2005-12171 A    1/2005
(Continued)

OTHER PUBLICATIONS

International Search Report for PCT Patent App. No. PCT/JP2012/057662 (Jul. 3, 2012).
Written Opinion for PCT Patent App. No. PCT/JP2012/057662 (Jul. 3, 2012). [Partial English language translation included].

*Primary Examiner* — Bob M Kunemund
(74) *Attorney, Agent, or Firm* — Cermak Nakajima LLP; Tomoko Nakajima (57) ABSTRACT

A gallium nitride layer is produced using a seed crystal substrate by flux method. The seed crystal substrate 8A includes a supporting body 1, a plurality of seed crystal layers 4A each comprising gallium nitride single crystal and separated from one another, a low temperature buffer layer 2 provided between the seed crystal layers 4A and the supporting body and made of a nitride of a group III metal element, and an exposed layer 3 exposed to spaces between the adjacent seed crystal layers 4A and made of aluminum nitride single crystal or aluminum gallium nitride single crystal. The gallium nitride layer is grown on the seed crystal layers by flux method.

12 Claims, 10 Drawing Sheets

(56) References Cited

U.S. PATENT DOCUMENTS

| | | | |
|---|---|---|---|
| 7,294,201 B2 * | 11/2007 | Morita | 117/90 |
| 2004/0123796 A1 | 7/2004 | Nagai et al. | |
| 2004/0147096 A1 | 7/2004 | Kitaoka et al. | |
| 2004/0183090 A1 | 9/2004 | Kitaoka et al. | |
| 2011/0100292 A1 | 5/2011 | Uematsu et al. | |

FOREIGN PATENT DOCUMENTS

| | | |
|---|---|---|
| JP | 2009-184847 A | 8/2009 |
| JP | 4422473 B2 | 12/2009 |
| JP | 4493427 B2 | 4/2010 |
| JP | 2010-163288 A | 7/2010 |
| WO | WO2010/007983 A1 | 1/2010 |

* cited by examiner

METHOD FOR PRODUCING GALLIUM NITRIDE LAYER AND SEED CRYSTAL SUBSTRATE USED IN SAME

TECHNICAL FIELD OF THE INVENTION

The present invention relates to a method for growing gallium nitride layers and seed crystal substrates used in the same.

BACKGROUND ARTS

Gallium nitride (GaN) thin film crystal draws attention as excellent blue light-emitting devices, has been used as a material for light-emitting diodes and expected as a blue-violet semiconductor laser device for an optical pickup. Recently, it draws attention as a semiconductor layer constituting electronic devices, such as high-speed IC chips, used for mobile phones or the like.

It is reported a method of obtaining a template substrate by depositing a seed crystal layer, such as GaN or AlN, on a single crystal substrate such as sapphire and of growing gallium nitride single crystal on the template substrate.

In the case that, however, the gallium nitride (GaN) seed crystal layer is grown on the substrate by vapor phase process by MOCVD and the gallium nitride single crystal is grown thereon by flux method, cracks are generated in the thus grown single crystal thick layer due to the difference of thermal expansion. For preventing the cracks, it is thus drawn attention the technique of reducing stress applied on the single crystal and of preventing the cracks, by spontaneously peeling the thus grown single crystal from the substrate.

According to Japanese Patent No. 4,422,473B, spaces are formed inside of a nitride layer of a nitride template substrate, GaN crystal is grown thereon by Na flux method, and the grown parts by flux method in the vicinity of the spaces are then separated (peeled) from the template. According to this process, however, complicated process steps are required, resulting in low productivity. Further, it is required to terminate the process of forming recesses in the nitride layer before the completion and the process control is difficult. Deviations are thus provided in the shapes of recesses so that the reproducibility in the peeling of the gallium nitride single crystal is low. Moreover, the film is grown over the whole surface of the MOCVD-GaN thin film so that the dislocation is not so reduced.

Further, according to another embodiment of Japanese Patent No. 4, 422, 473B, it is used, as a seed substrate, a nitride template including recesses in which sapphire is exposed and protrusions made of the nitride on the surface. GaN crystal is grown thereon by Na flux method and the portion grown by flux method in the vicinity of spaces formed by the recesses are separated (peeled) from the template. Since the sapphire-exposed part is present, however, the reproducibility is low when the gallium nitride single crystal is grown by liquid phase epitaxy by the flux method.

According to Japanese Patent Publication No. 2005-012171A, it is used, as a seed substrate, a nitride template substrate with a mask formed on the surface, and GaN crystal is grown by Na flux method to generate regions whose dislocation densities are low. According to the method, however, the reproducibility of the peeling of the grown gallium nitride single crystal is low and cracks tend to be generated if successfully peeled. Further, the single crystal includes periodically generated regions where dislocations are concentrated, so that it cannot be used over the whole surface.

According to another embodiment of Japanese Patent Publication No. 2005-012171A, a mask is formed on a surface of a sapphire body and a nitride layer is formed in its window parts to provide a seed substrate, which is used to grow GaN crystal by Na flux method to form regions with a low dislocation density. According to this method, however, the reproducibility of the peeling of the thus grown gallium nitride single crystal is low and cracks tends to be generated if peeled. Further, the single crystal includes periodically generated regions where dislocations are concentrated, so that it cannot be used over the whole surface.

Further, according to another embodiment of Japanese Patent Publication No. 2005-012171A, it is used a seed substrate including a sapphire body including recesses in which the sapphire body is exposed and protrusions made of a nitride. GaN crystal is grown thereon by Na flux method to generate regions whose dislocation densities are low. According to this method, the sapphire-exposed regions are present so that the reproducibility of the liquid phase growth of the gallium nitride single crystal is low.

Besides, Japanese Patent No. 4, 493, 427B describes a method of producing a layer of AlN single crystal.

It was further proposed a method of forming a low temperature buffer layer on a sapphire body, of forming a seed crystal layer thereon and of growing gallium nitride single crystal on the seed crystal layer. According to this method, the single crystal is peeled off using the stress applied by the cooling after the growth of the single crystal as a trigger (Japanese Patent Publication No. 2009-184,847A).

SUMMARY OF THE INVENTION

An object of the present invention is, in growing GaN layer on a seed crystal substrate by flux method, to facilitate spontaneous peeling of the thus grown GaN layer without cracks, to grow the GaN layer over a large area as possible with a high reproducibility and to provide the GaN layer having a low dislocation density and good crystal quality.

The present invention provides a method of producing a gallium nitride layer using a seed crystal substrate by flux method.

The seed crystal substrate comprises a supporting body, a plurality of seed crystal layers each comprising gallium nitride single crystal and separated from one another, a low temperature buffer layer, provided between the seed crystal layer and the supporting body and comprising a group III metal nitride, and an exposed layer exposed to spaces between the adjacent seed crystal layers and comprising aluminum nitride single crystal or aluminum gallium nitride single crystal. The method comprises the step of growing the gallium nitride layer on the seed crystal layers by flux method.

The present invention further provides a seed crystal substrate for growing a gallium nitride layer by flux method. The seed crystal substrate includes:

a supporting body;

a plurality of seed crystal layers each comprising gallium nitride single crystal and separated from one another, a low temperature buffer layer provided between the seed crystal layer and the supporting body and comprising a group III metal nitride; and an exposed layer exposing to spaces between the adjacent seed crystal layers and comprising aluminum nitride single crystal or aluminum gallium nitride single crystal.

According to the present invention, the grown GaN layer can be spontaneously peeled off without cracks, the GaN layer can be grown over a wide area of the seed crystal layer with a high reproducibility, and the GaN layer having a low dislocation density and good crystal quality can be obtained.

EMBODIMENTS OF THE INVENTION

Figure 1:
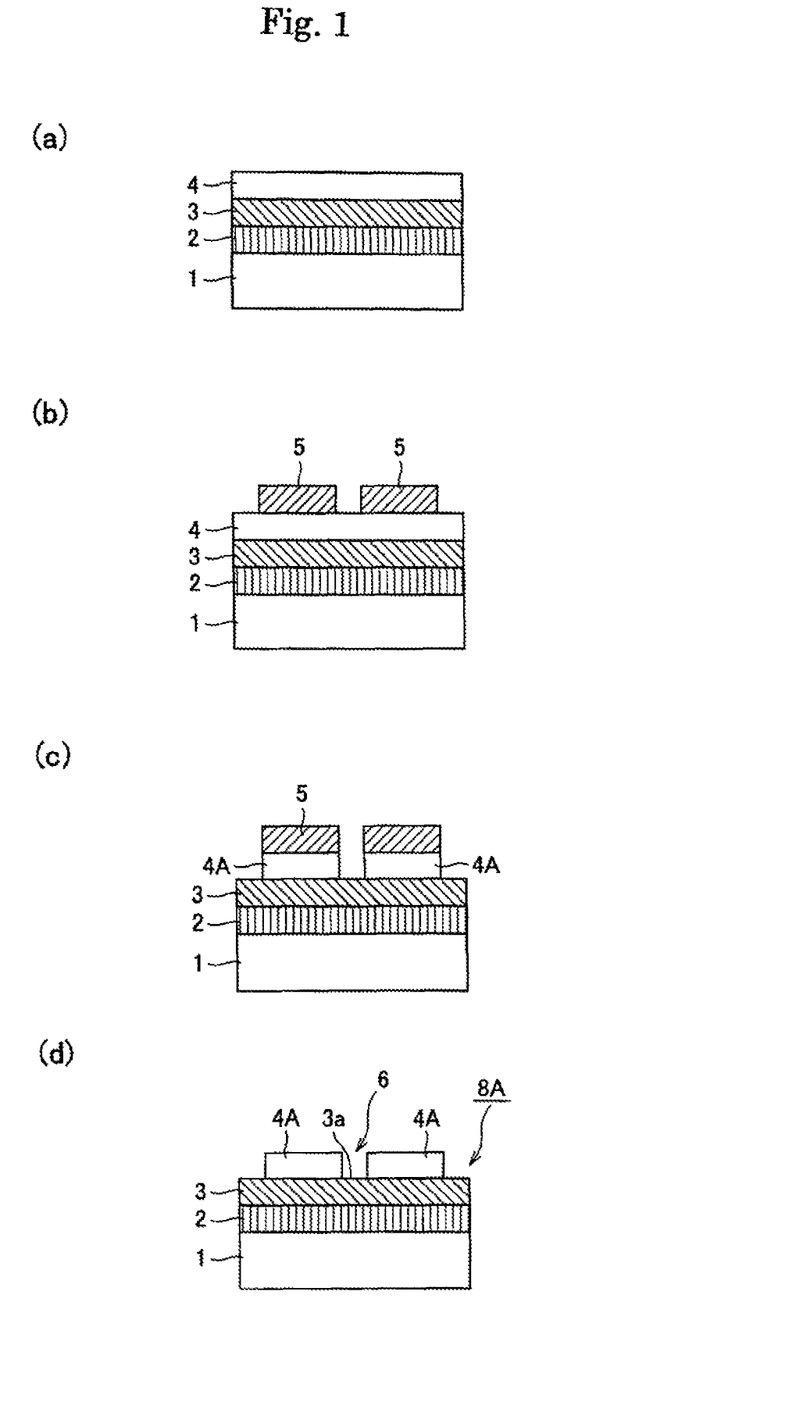
FIGS. 1(a) to 1(d) are views schematically showing process steps of producing a seed crystal substrate 8A according to an embodiment of the present invention.
Figure 2:
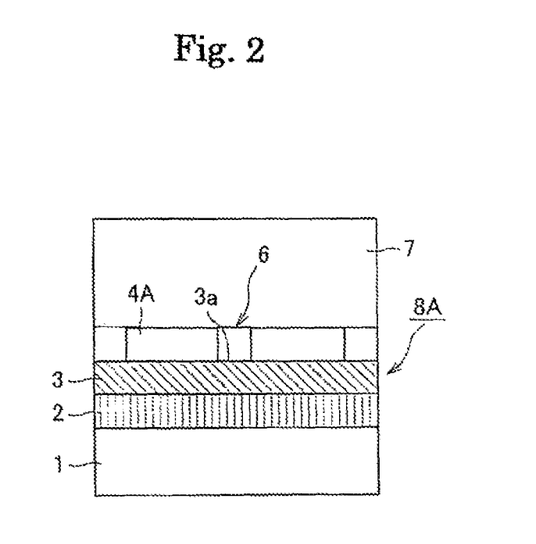
FIG. 2 is a view schematically showing a gallium nitride single crystal 7 grown on the seed crystal substrate 8A.

According to an example of FIGS. 1 and 2, it is provided an intermediate layer composed of aluminum nitride or aluminum gallium nitride single crystal on a low temperature buffer layer, and the intermediate layer includes an exposed layer.

That is, as shown in FIG. 1(a), the low temperature buffer layer 2 composed of a nitride of a group III element on a surface of the supporting body 1. Then, on the low temperature buffer layer 2, it is formed an intermediate layer 3 composed of aluminum nitride single crystal or aluminum gallium nitride single crystal. Here, the low temperature buffer layer 2 and intermediate layer 3 are not patterned. Then, on the intermediate layer 3, it is formed a seed crystal layer 4 composed of gallium nitride single crystal.

Then, as shown in FIG. 1(b), a mask 5 is formed on the seed crystal layer 4, and as shown in FIG. 1(c), the seed crystal layer 4 is patterned to form a plurality of seed crystal layers 4A separated from one another. Spaces are formed between the adjacent seed crystal layers 4A. Then, as shown in FIG. 1(d), the mask 5 is removed to expose the seed crystal layers 4A. At the time, exposed layers 3a of the underlying intermediate layer 3 are exposed in the spaces 6 of the adjacent seed crystal layers 4A.

Then, as shown in FIG. 2, gallium nitride single crystal 7 is epitaxially grown on the seed crystal layers 4A by flux method. At the time, the layer 7 is grown so as to connect with each other across the spaces 6 between the seed crystals 4A to form an integrated layer 7. Then, the layer 7 is easily peeled off from the supporting body 1 along the low temperature buffer layer 7, so that a self-standing substrate of the single crystal can be obtained.

Figure 3:
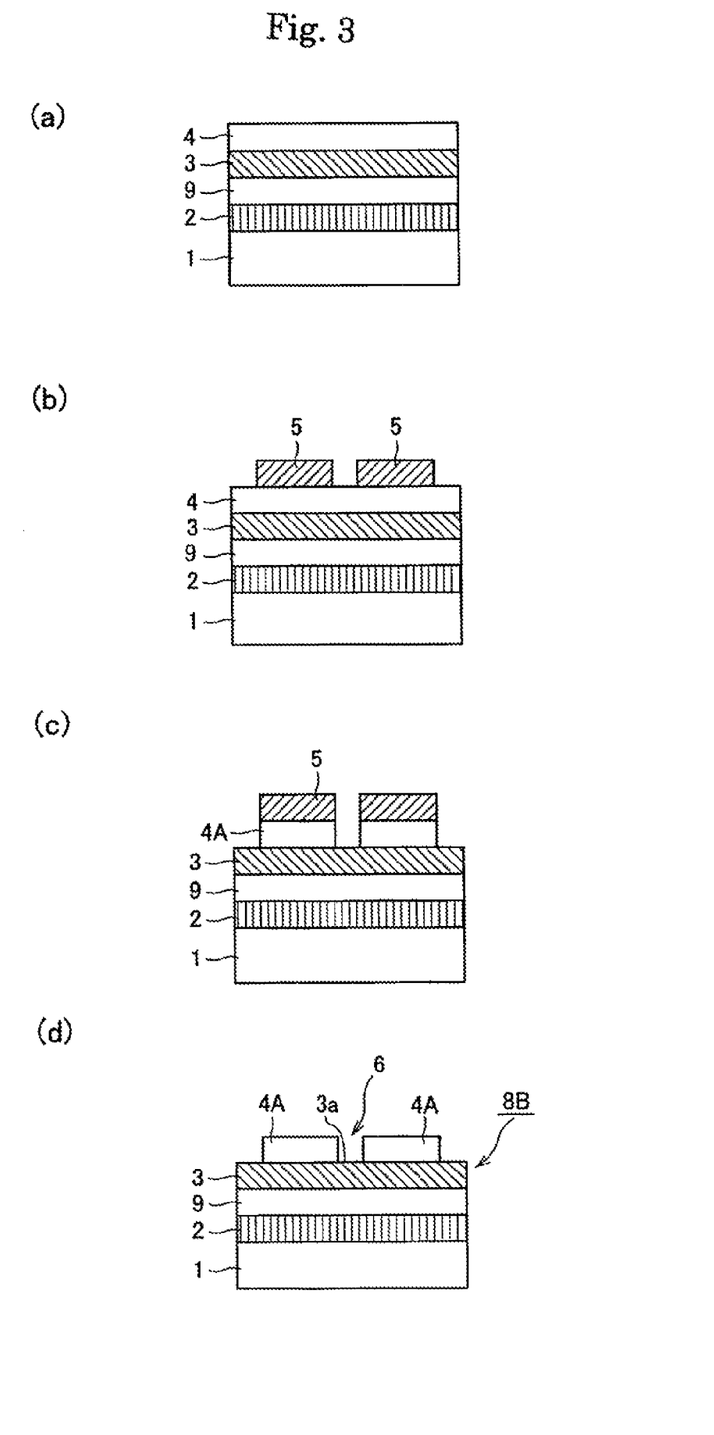
FIGS. 3(a) to 3(d) are views schematically showing process steps of producing a seed crystal substrate 8B according to another embodiment of the present invention.
Figure 4:
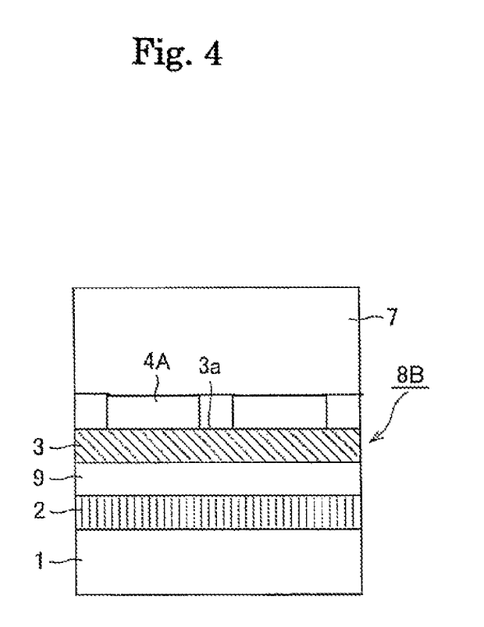
FIG. 4 is a view schematically showing a gallium nitride single crystal 7 grown on the seed crystal substrate 8B.

Further, according to another embodiment, it is provided the intermediate layer composed of aluminum nitride single crystal or aluminum gallium nitride single crystal on the low temperature buffer layer, and the gallium nitride single crystal layer is provided between the intermediate layer and low temperature buffer layer. FIGS. 3 and 4 relate to this embodiment.

That is, as shown in FIG. 3(a), the low temperature buffer layer 2 made of a nitride of the Group III element on a surface of the supporting body 1. Then, on the low temperature buffer layer 2, a gallium nitride single crystal layer 9 and an intermediate layer 3 composed of aluminum nitride single crystal or aluminum gallium nitride single crystal are formed in the order. Here, the low temperature buffer layer 2, gallium nitride single crystal layer 9 and intermediate layer 3 are not patterned. Then, the seed crystal layer 4 composed of gallium nitride single crystal is formed on the intermediate layer 3.

Then, as shown in FIG. 3(b), a mask 5 is formed on the seed crystal layer 4, and as shown in FIG. 3(c), the seed crystal layer 4 is patterned to form a plurality of seed crystal layers 4A separated from one another. Spaces are formed between the adjacent seed crystal layers 4A. Then, the mask 5 is removed as shown in FIG. 3(d) to expose the seed crystal layers. At the time, the exposed layer 3a of the underlying intermediate layer 3 is exposed in the spaces 6 between the adjacent seed crystal layers 4A.

Then, as shown in FIG. 4, gallium nitride single crystal 7 is epitaxially grown by flux method on the seed crystal layer 4A. At the time, the layer 7 is grown so as to connect with each other across the spaces 6 of the seed crystals 4A to form an integrated layer 7. Then, the layer 7 is easily peeled off from the supporting body 1 along the low temperature buffer layer 2 upon cooling, so that a self-standing substrate of the single crystal can be obtained.

Figure 5:
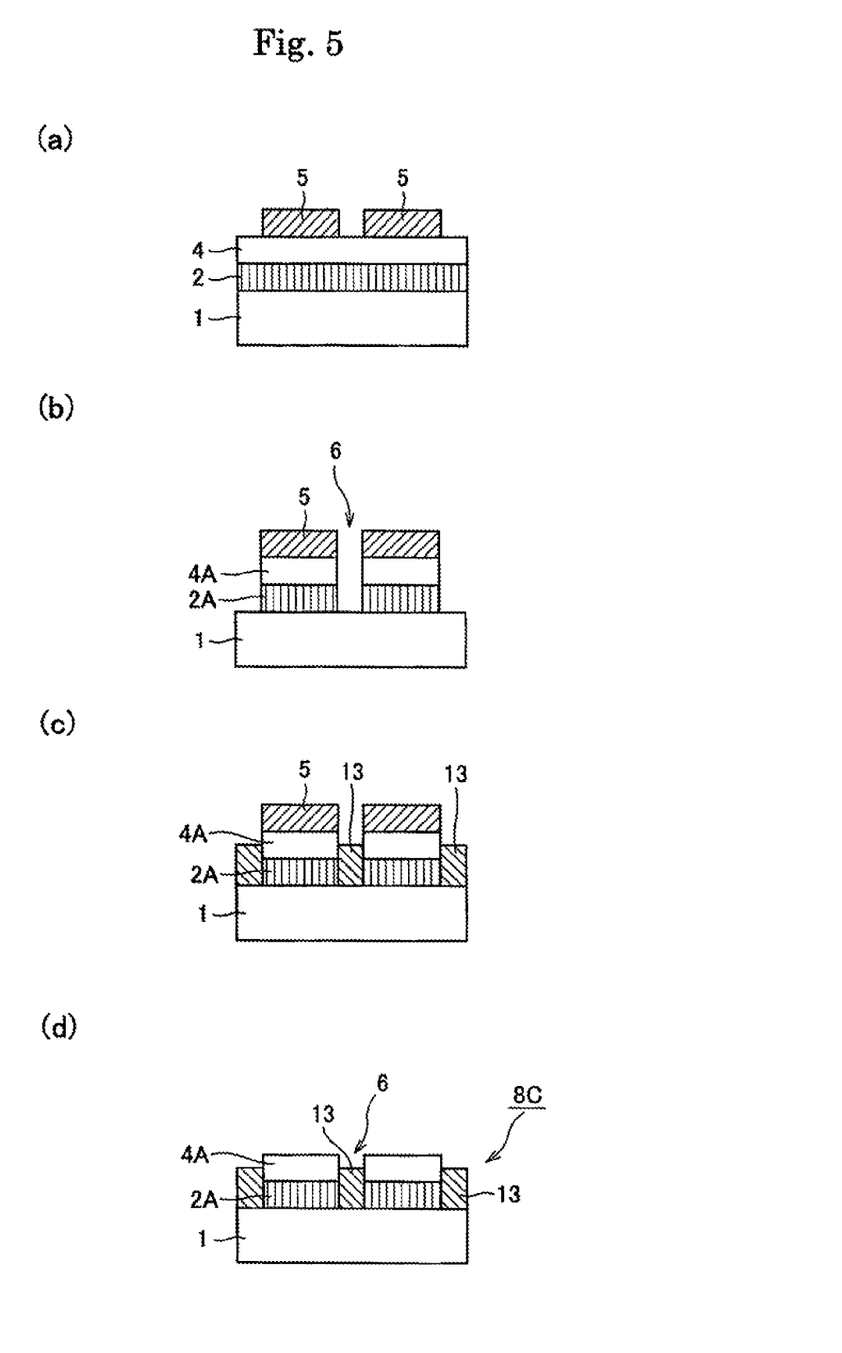
FIGS. 5(a) to 5(d) are views schematically showing process steps of producing a seed crystal substrate 8C according to still another embodiment of the present invention.

Further, according to a preferred embodiment, a low temperature buffer layer is separated into a plurality of separated parts, spaces between the adjacent separated parts are communicated with the spaces between the seed crystal layers, and an exposed layer is formed on a surface of the supporting body. FIG. 5 relates to this embodiment.

As shown in FIG. 5(a), the low temperature buffer layer 2 composed of a nitride of the Group III element is formed on a surface of the supporting body. Then, the seed crystal layer 4 composed of gallium nitride single crystal is formed on the low temperature buffer layer 2 without providing the intermediate layer. Then, a mask 5 is formed on the seed crystal layer 4, and as shown in FIG. 5 (b), the seed crystal layer 4 and low temperature buffer layer 2 are patterned to form a plurality of seed crystal layers 4A and low temperature buffer layers 2A separated from one another. Spaces 6 are formed between the adjacent seed crystal layers 4A and between the adjacent low temperature buffer layers 2A.

Then, as shown in FIG. 5(c), it is formed an exposed layer 13 composed of aluminum nitride single crystal or aluminum gallium nitride single crystal in the space 6. The mask 5 is then removed to expose the seed crystal layers 4A. At the time, exposed surface of the exposed layers 13 are exposed in the spaces 6 between the adjacent seed crystal layers 4A and adjacent separated layers 2A.

Then, as shown in FIG. 2, gallium nitride single crystal 7 is epitaxially grown by flux method on the seed crystal layers 4A. At the time, the layer 7 is grown so as to connect with each other across the spaces 6 of the seed crystals 4A to form an integrated layer 7. Then, the layer 7 is easily peeled off from the supporting body 1 along the low temperature buffer layer 2A upon cooling, so that a self-standing substrate of the single crystal can be obtained.

Figure 6:
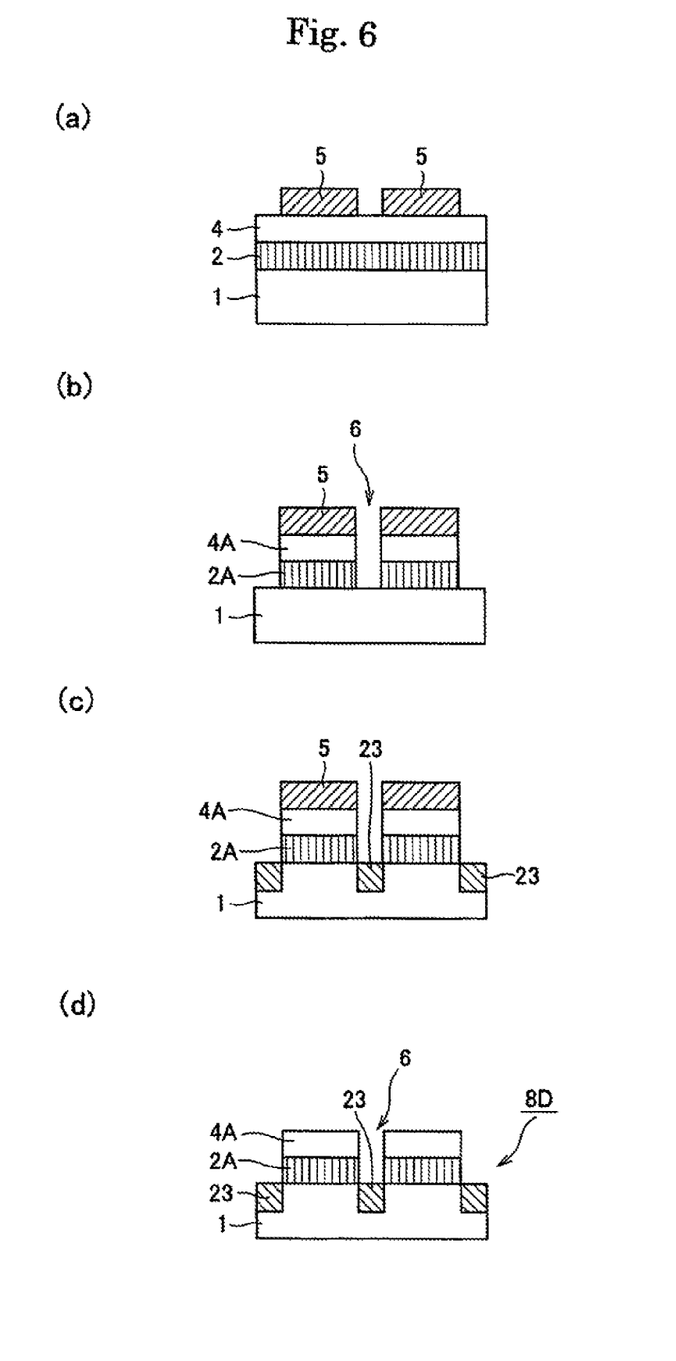
FIGS. 6(a) to 6(d) are views schematically showing process steps of producing a seed crystal substrate 8D according to still another embodiment of the present invention.

Further, according to another embodiment, the low temperature buffer layer is separated into a plurality of separated parts, spaces between the adjacent separated parts are communicated with the spaces between the seed crystal layers, respectively, the supporting body is made of sapphire, and the supporting body is subjected to surface nitridization to form exposed layers. FIG. 6 relates to this embodiment.

As shown in FIG. 6(a), the low temperature buffer layer 2 composed of a nitride of the Group III element is formed on a surface of the supporting body 1. Then, the seed crystal layer 4 composed of gallium nitride is formed on the low temperature buffer layer 2 without providing the intermediate layer. Then, the mask 5 is formed on the seed crystal layer 4 and as shown in FIG. 6(b), the seed crystal layer 4 and low temperature buffer layer 2 are patterned to form a plurality of seed crystal layers 4A and low temperature buffer layers 2A separated from one another. Spaces are formed between the adjacent seed crystal layers 4A and the adjacent low temperature buffer layers 2A.

Then, as shown in FIG. 6(c), the supporting body 1 is subjected to surface nitridization in the spaces 6 to form exposed layers 23 composed of aluminum nitride. Then, the mask 5 is removed to expose the seed crystal layers 4A. At the time, exposed surfaces of the exposed layer 13 are exposed through the spaces 6 between the adjacent seed crystal layers 4A and adjacent separated layers 2A.

Then, for example as shown in FIG. 2, gallium nitride single crystal 7 is epitaxially grown by flux method on the seed crystal layers 4A. At the time, the layer 7 is grown so as to connect with each other across the spaces 6 of the seed crystals 4A to form an integrated layer 7. Then, the layer 7 is easily peeled off from the supporting body 1 along the low temperature buffer layer 2A upon cooling, so that a self-standing substrate of the single crystal can be obtained.

Figure 7:
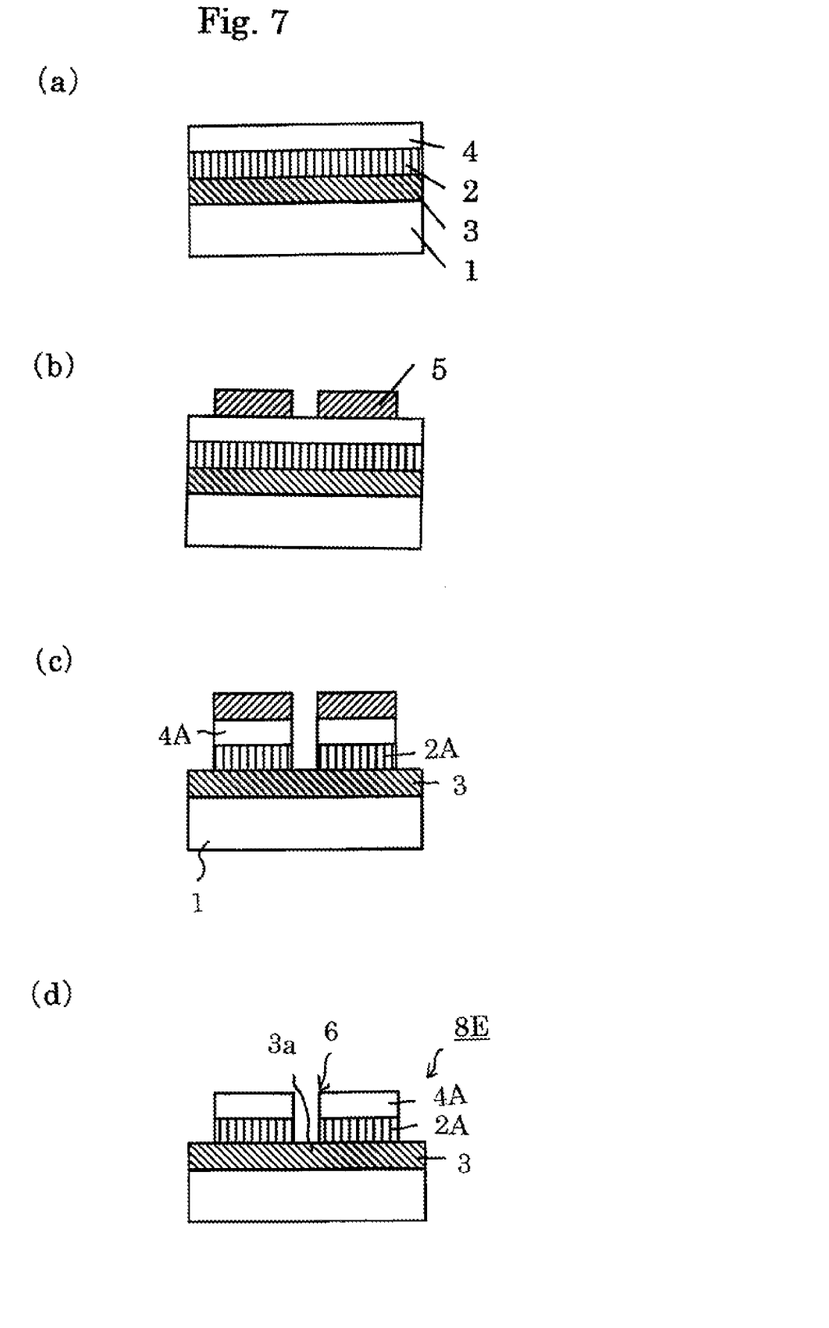
FIGS. 7(a) to 7(d) are views schematically showing process steps of producing a seed crystal substrate according to still another embodiment of the present invention.

Further, according to another embodiment, it is provided a layer of aluminum nitride single crystal or aluminum gallium nitride single crystal provided between the low temperature buffer layer and supporting body, the low temperature buffer layer is separated into a plurality of separated parts, spaces between the adjacent separated parts are communicated with spaces between the seed crystal layers, respectively, and the layer of aluminum nitride single crystal or aluminum gallium nitride single crystal are exposed to the spaces. FIG. 7 relates to this embodiment.

As shown in FIG. 7(a), on the surface of the supporting body 1, the layer 3 of aluminum nitride single crystal or aluminum gallium nitride single crystal, the low temperature buffer layer 2 and the seed crystal layer 4 composed of gallium nitride single crystal are formed in the order.

Then, as shown in FIG. 7(b), a mask 5 is formed on the seed crystal layer 4, and as shown in FIG. 7(c), the seed crystal layer 4 and low temperature buffer layer 2 are patterned to form a plurality of seed crystal layers 4A and low temperature buffer layers 2A separated from one another. Spaces 6 are formed between the adjacent seed crystal layers 4A and adjacent low temperature buffer layers 2A, so that exposed layer 3a of the underlying layer 3 of aluminum nitride single crystal or aluminum gallium nitride single crystal is exposed to the space 6.

Then, for example as shown in FIG. 2, gallium nitride single crystal 7 is epitaxially grown by flux method on the seed crystal layers 4A. At the time, the layer 7 is grown so as to connect with each other across the spaces 6 of the seed crystals 4A to form an integrated layer 7. Then, the layer 7 is easily peeled off from the supporting body 1 along the low temperature buffer layer 2A upon cooling, so that a self-standing substrate of the single crystal can be obtained.

According to the present invention, the supporting body 1 is not particularly limited as far as a nitride of the Group III element can be grown. It includes sapphire, silicon single crystal, SiC single crystal, MgO single crystal, ZnO single crystal, spinel ($MgAl_2O_4$), $LiAlO_2$, $LiGaO_2$, and perovskite composite oxides such as $LaAlO_3$, $LaGaO_3$ and $NdGaO_3$. Also, it is possible to use cubic perovskite structure composite oxides represented by the composition formula $[A_{1-y}(Sr_{1-x}Ba_x)_y][(Al_{1-z}Ga_z)_{1-u}.D_u]O_3$ (where A is a rare-earth element, D is one or more elements selected from the group consisting of niobium and tantalum, y=0.3 to 0.98, x=0 to 1, z=0 to 1, u=0.15 to 0.49, and x+z=0.1 to 2). In addition, SCAM ($ScAlMgO_4$) may be also used.

The wurtzite-type structure of a nitride of the Group III element includes c-face, a-face and m-face. Each of these crystalline faces are defined based on crystallography. The low temperature buffer layer, intermediate layer, seed crystal layer and gallium nitride single crystal grown by flux method may be grown in a direction normal with respect to c-face, or each of normal line direction of a non-polar face such as a-face and m-face and a semi polar face such as R face.

The nitride of the Group III element forming the low temperature buffer layer may preferably be a nitride of one or more metal selected from the group of Ga, Al and In, and more preferably be GaN, AlN, AlGaN or the like. Further, these nitrides may contain unintended impurity elements. Further, for controlling the conductivity, it may contain a dopant, intentionally added, such as Si, Ge, Be, Mg, Zn, Cd or the like.

The low temperature buffer layer and seed crystal layer may preferably be formed by a vapor growth method including metal organic chemical vapor deposition (MOCVD), hydride vapor phase epitaxy (HVPE), pulse-excited deposition (PXD), MBE and sublimation techniques. Organic metal chemical vapor deposition is most preferred.

The thickness of the low temperature buffer layer is not particularly limited, and may preferably be 10 nm or larger, and preferably be 500 nm or smaller and more preferably be 250 nm or smaller. The thickness of the seed crystal layer is not particularly limited, and may preferably be 0.5 μm or larger and more preferably be 10 μm or larger on the viewpoint of preventing melt-back of the seed crystal layer. Further, as the thickness of the seed crystal layer is larger, it takes more time for the formation of the seed crystal layer. On the viewpoint, the thickness of the seed crystal layer may preferably be 50 μm or smaller.

On the viewpoint of facility the peeling of the single crystal from the supporting body, it is preferred that the growth temperature of the seed crystal layer is higher than that of the low temperature buffer layer. The temperature difference may preferably be 100° C. or larger and more preferably be 200° C. or larger.

The growth temperature of the low temperature buffer layer may preferably be 400° C. or higher, more preferably be 450° C. or higher, and preferably be 750° C. or lower and more preferably be 700° C. or lower. The growth temperature of the single crystal layer may preferably be 950° C. or higher and more preferably be 1050° C. or higher, and preferably be 1200° C. or lower and more preferably be 1150° C. or lower.

In the case that the seed crystal layer is produced by organic metal vapor phase deposition, the raw materials may preferably be trimethyl gallium (TMG) and ammonia.

As the low temperature buffer layer is formed at a relatively low temperature as described above, the component of the low temperature buffer layer may be evaporated during the subsequent growth of the seed crystal layer to leave spaces in the low temperature buffer layer. In this case, the crystal quality of the seed crystal layer may be deteriorated so that the crystal quality of the single crystal 7 may be subjected to deterioration. Therefore, according to a preferred embodiment, after the low temperature buffer layer 2 is formed, it is formed a layer for preventing the evaporation of components of the low temperature buffer layer 2. It is thereby possible to prevent the formation of spaces in the low temperature buffer layer 2 during the growth of the seed crystal layer and to prevent the deterioration of the crystal quality of the seed crystal layer. The material of such layer of preventing evaporation includes GaN, AlN, AlGaN or the like.

The layer of preventing evaporation may be grown according to vapor phase process as described above. The growth temperature of the layer of preventing evaporation may preferably be 400 to 900° C. The difference between the growth temperature of the layer of preventing evaporation and that of the intermediate layer may preferably be 0 to 100° C.

According to the present embodiment, more preferably, the material of the low temperature buffer layer is InGaN, InAlN or InAlGaN, and the component susceptible to evaporation is In. Then, the material of the layer of preventing evaporation is GaN, AlN or AlGaN. Such layer of preventing evaporation can be easily formed by terminating the supply of only In raw material gas during the formation of InGaN, InAlN or InAlGaN.

Further, in the case that the low temperature buffer layer is composed of a super lattice structure, it is possible to give the function as the layer of preventing evaporation to thin layers in the super lattice structure, so that it is possible to prevent the formation of the spaces in the intermediate layer. In this case, the layer of preventing evaporation is not necessary.

The exposed layer, particularly the intermediate layer including the exposed layer, is composed of aluminum nitride single crystal or aluminum gallium nitride single crystal. Here, an atomic ratio of aluminum in the aluminum gallium nitride single crystal may preferably be 30 percent or higher.

The method of forming the exposed layer and intermediate layer is preferably vapor phase process including metal organic chemical vapor deposition (MOCVD), hydride vapor phase epitaxy (HVPE), pulse-excited deposition (PXD), MBE and sublimation techniques. Organic metal chemical vapor deposition is most preferred.

The thickness of the exposed layer or intermediate layer is not particularly limited, and may preferably be 10 nm or larger and preferably be 500 nm or smaller and more preferably be 250 nm or smaller. Further, the growth temperature of the exposed and intermediate layers may preferably be 950° C. or higher and more preferably be 1050° C. or higher, and preferably be 1200° C. or lower.

In the case that the exposed layer and intermediate layer are produced by metal organic vapor phase deposition method, the raw material may preferably be trimethyl ammonium, trimethyl gallium and ammonia.

In the case that the supporting body is subjected to nitridization to form the exposed layer 23, the material of the supporting body may preferably be sapphire. Further for performing the nitridization, the supporting body is subjected to annealing under nitrogen containing atmosphere. The annealing temperature may preferably be 800 to 1200° C.

On the viewpoint of improving the quality of the single crystal, the minimum width of each of the seed crystal layers may preferably be 600 μm or smaller and more preferably be 400 μm or smaller. Further, on the viewpoint of stably holding the single crystal 7 during the growth of the single crystal, it may preferably be 10 μm or larger and more preferably be 25 μm or larger. Here, the minimum width of the seed crystal layer means a length of a straight line having the smallest length, among straight lines connecting optional two points on an outline of the seed crystal layer. Therefore, in the case that the seed crystal layer has a shape of a band or a stripe, it is the length of the narrow side, in the case that the seed crystal layer has a shape of a circle, it is its diameter, and in the case that the seed crystal layer has a shape of a regular polygon, it is a distance between a pair of opposing sides.

A distance of the spaces 6 between the seed crystal layers may preferably be 250 μm or larger and more preferably 500 μm or larger, on the viewpoint of improving quality of the single crystal. The distance may preferably be 4000 μm or smaller and more preferably be 3000 μm or smaller, on the viewpoint of facilitating that the single crystals grown from the adjacent seed crystal layers are connected and integrated with each other.

According to the present invention, the gallium nitride layer 7 is grown on the seed crystals by flux method. For this, the kind of flux is not particularly limited, as far as gallium nitride can be generated. According to a preferred embodiment, it is used a flux containing at least one of an alkali metal and alkali earth metal, and it is particularly preferred a flux containing sodium metal.

Raw materials for gallium includes gallium pure metal, gallium alloy and gallium compound, and gallium pure metal is preferred on the viewpoint of handling.

The growth temperature of the single crystal of the nitride of the Group III element and holding time for the growth in the flux method are not particularly preferred, and appropriately adjusted depending on the kind of the target single crystal and composition of flux. For example, in the case that gallium nitride single crystal is grown using flux containing sodium or lithium, the growth temperature may be made 800 to 1000° C.

According to flux method, the single crystal is grown under gas atmosphere containing molecules including nitrogen atoms. Although the gas may preferably be nitrogen gas, it may be ammonia. Although the total pressure of the atmosphere is not particularly limited, on the viewpoint of preventing evaporation of flux, it may preferably be 1 MPa or higher and more preferably be 3 MPa or higher. However, as the pressure becomes higher, the system tends to be larger, and the total pressure may preferably be 200 MPa or lower and more preferably be 50 MPa or lower. Although a gas other than nitrogen in the atmosphere is not limited, it may preferably be an inert gas and more preferably be argon, helium or neon.

EXAMPLES

Example 1

Gallium nitride single crystal was grown according to the method described referring to FIGS. 1 and 2.

Specifically, on a surface of a c-face sapphire body 1 having a diameter of 3 inches, an AlN low temperature buffer layer 2, an intermediate layer 3 composed of AlN single crystal and a seed crystal layer 4 composed of gallium nitride single crystal were epitaxially grown by MOCVD method. Raw materials and growth temperature were shown below.
(AlN Low Temperature Buffer Layer 2)
 Raw materials: trimethyl ammonium, ammonia
 Growth temperature: 500° C.
(Intermediate Layer 3 Made of AlN Single Crystal)
 Raw materials: trimethyl ammonium, ammonia,
 Growth temperature: 1200° C.

(Seed Crystal Layer 4 Made of Gallium Nitride Single Crystal)
Raw materials: trimethyl gallium, ammonia
Growth temperature: 1050° C.

In a central region of φ54 mm of the multi-layered template, a mask layer 5 of SiO₂ having a shape of stripes each having a width of 0.05 mm and a period of 0.55 mm using photolithography. At this time, the direction of each stripe was made parallel with the direction of m-axis of the gallium nitride single crystal 4. The seed crystal layer 4 was etched by using ICP-RIE system and gas mixture of chlorine and boron trichloride until the underlying intermediate layer 3 is exposed. The SiO₂ mask layer 5 was removed using buffered fluoric acid and washing with pure water was performed.

In the thus produced seed crystal substrate 8A, seed crystal layers 4A with a width of 50 μm were formed in the inner region with a diameter of 54 mm of the seed crystal substrate of φ3 inches, and the intermediate layer 3 is exposed in the other region. Then, by flux method, gallium nitride single crystal 7 was grown on the seed crystal substrate. Specifically, it was used a cylindrical crucible with a flat bottom having an inner diameter of 80 mm and a height of 45 mm, and raw materials for the growth (Ga metal 60 g, Na metal 60 g) were filled in the crucible in a glove box. After the crucible was contained and sealed in a container made of a heat-resistant metal, the container was set on a table, in a crystal growing furnace, which can be rotated and shaken. After the temperature was raised to 870° C. and pressure was raised to 4.0 MPa, it was held for 100 hours while the solution was agitated by shaking and rotating to perform the crystal growth. Thereafter, the temperature was cooled to room temperature over 10 hours. Thereafter, the growth container was drawn out of the crystal growth furnace, ethanol was used to remove the flux and the thus grown gallium nitride was collected.

The thus obtained gallium nitride crystal plate 7 was grown over the whole surface in the region of φ54 mm in the center of the seed crystal substrate, and had a thickness of about 1.5 mm. Further, it was peeled off from the sapphire body over the whole surface and self-standing without cracks confirmed. The dislocation density was $10^4/cm^2$ or lower over the whole surface. The rate of the growth over the whole surface was 100 percent, rate of crack-free was 95 percent, and the yield of collection of the gallium nitride crystal plate was 95 percent, according to the similar experiment.

Example 2

The gallium nitride crystal plate was produced according to the method described referring to FIGS. 3 and 4. It was carried out according to the same procedure as the Example 1, except that a GaN low temperature buffer layer 2, gallium nitride single crystal layer 9, an intermediate layer 3 made of AlN single crystal and a seed crystal layer 4 made of gallium nitride single crystal were epitaxially grown by MOCVD method on a surface of a c-face sapphire body with a diameter of 3 inches.
(GaN Low Temperature Buffer Layer 2)
Raw materials: trimethyl gallium, ammonia
Growth temperature: 550° C.
(Gallium Nitride Single Crystal Layer 9)
Raw materials: trimethyl gallium, ammonia
Growth temperature: 1050° C.
(Intermediate Layer 3 Made of AlN Single Crystal)
Raw materials: trimethyl aluminum, ammonia
Growth temperature: 1200° C.
(Seed Crystal Layer 4 Made of Gallium Nitride Single Crystal)
Raw materials: trimethyl gallium, ammonia
Growth temperature: 1050° C.

The thus obtained gallium nitride crystal plate 7 was grown over the whole surface of the region of φ54 mm in the center of the seed crystal substrate, and had a thickness of about 1.5 mm. Further, it was peeled off from the sapphire body over the whole surface and self-standing without cracks confirmed. The dislocation density was $10^4/cm^2$ or lower over the whole surface. The rate of the growth over the whole surface was 100 percent, rate of crack-free was 95 percent, and the yield of collection of the gallium nitride crystal plate was 95 percent, according to the similar experiment.

Example 3

The seed crystal substrate 8C was produced according to the procedure described referring to FIG. 5.

Specifically, the GaN low temperature buffer layer 2 and the seed crystal layer 4 composed of gallium nitride single crystal were epitaxially grown on a surface of the c-face sapphire body 1 with a diameter of 3 inches by MOCVD method.
(GaN Low Temperature Buffer Layer 2)
Raw materials: trimethyl gallium, ammonia
Growth temperature: 550° C.
(Seed Crystal Layer 4 Made of Gallium Nitride Single Crystal)
Raw materials: trimethyl gallium, ammonia
Growth temperature: 1050° C.

In a central region of φ54 mm of the GaN template, a mask layer 5 of SiO₂ having a shape of stripes each having a width of 0.05 mm and a period of 0.55 mm using photolithography. At this time, the direction of the stripe was made parallel with the direction of m-axis of the gallium nitride single crystal layer 4. The seed crystal layer was etched by using ICP-RIE system and gas mixture of chlorine and boron trichloride until the underlying sapphire body 1 was exposed. Thereafter, the exposed layer 13 of AlN single crystal was epitaxially grown on the exposed sapphire by MOCVD method. The SiO2 mask layer 5 was removed using buffered fluoric acid and washing with pure water was performed.

In the thus produced seed crystal substrate 8C, a seed crystal layer with a width of 50 μm was formed in the inner region with a diameter of 54 mm of the seed crystal substrate of φ3 inches, and the AlN single crystal layer was exposed in the other region.

The gallium nitride crystal plate was produced according to the same procedure as the Example 1.

The thus obtained gallium nitride crystal plate was grown over the whole surface of the region of φ54 mm in the center of the seed crystal substrate, and had a thickness of about 1.5 mm. Further, it was peeled off from the sapphire body over the whole surface and self-standing without cracks confirmed. The dislocation density was $10^4/cm^2$ or lower over the whole surface. The rate of the growth over the whole surface was 95 percent, rate of crack-free was 95 percent, and the yield of collection of the gallium nitride crystal plate was 90 percent, according to the similar experiment.

Example 4

The gallium nitride single crystal was produced according to the method described referring to FIG. 6.

Specifically, a GaN low temperature buffer layer 2 and a seed crystal layer 4 made of gallium nitride single crystal were epitaxially grown by MOCVD method on a surface of a c-face sapphire body 1 having a diameter of 3 inches.

(GaN Low Temperature Buffer Layer 2)
Raw materials: trimethyl gallium, ammonia
Growth temperature: 550° C.

(Seed Crystal Layer 4 Made of Gallium Nitride Single Crystal)
Raw materials: trimethyl gallium, ammonia
Growth temperature: 1050° C.

In a central region of φ54 mm of the GaN template, a mask layer 5 of SiO$_2$ having a shape of stripes each having a width of 0.05 mm and a period of 0.55 mm were formed using photolithography. At this time, the direction of the stripe was made parallel with the direction of m-axis of the gallium nitride single crystal layer 4. The seed crystal layer was etched by using ICP-RIE system and gas mixture of chlorine and boron trichloride until the underlying sapphire body 1 was exposed. It was then subjected to annealing treatment in nitrogen gas atmosphere for the nitridization of the sapphire surface to form the exposed layers 23 made of AlN. The SiO$_2$ mask layer 5 was removed using buffered fluoric acid and washing with pure water was performed.

In the thus produced seed crystal substrate 8D, a seed crystal layer with a width of 50 μm was formed in the inner region with a diameter of 54 mm of the seed crystal substrate of φ3 inches, and the AlN single crystal layer was exposed in the other region.

The gallium nitride crystal plate was produced according to the same procedure as the Example 1.

The thus obtained gallium nitride crystal plate was grown over the whole surface of the region of φ54 mm in the center of the seed crystal substrate, and had a thickness of about 1.5 mm. Further, it was peeled off from the sapphire body over the whole surface and self-standing without cracks confirmed. The dislocation density was $10^4/cm^2$ or lower over the whole surface. The rate of the growth over the whole surface was 95 percent, rate of crack-free was 95 percent, and the yield of collection of the gallium nitride crystal plate was 90 percent, according to the similar experiment.

Comparative Example 1

Figure 8:
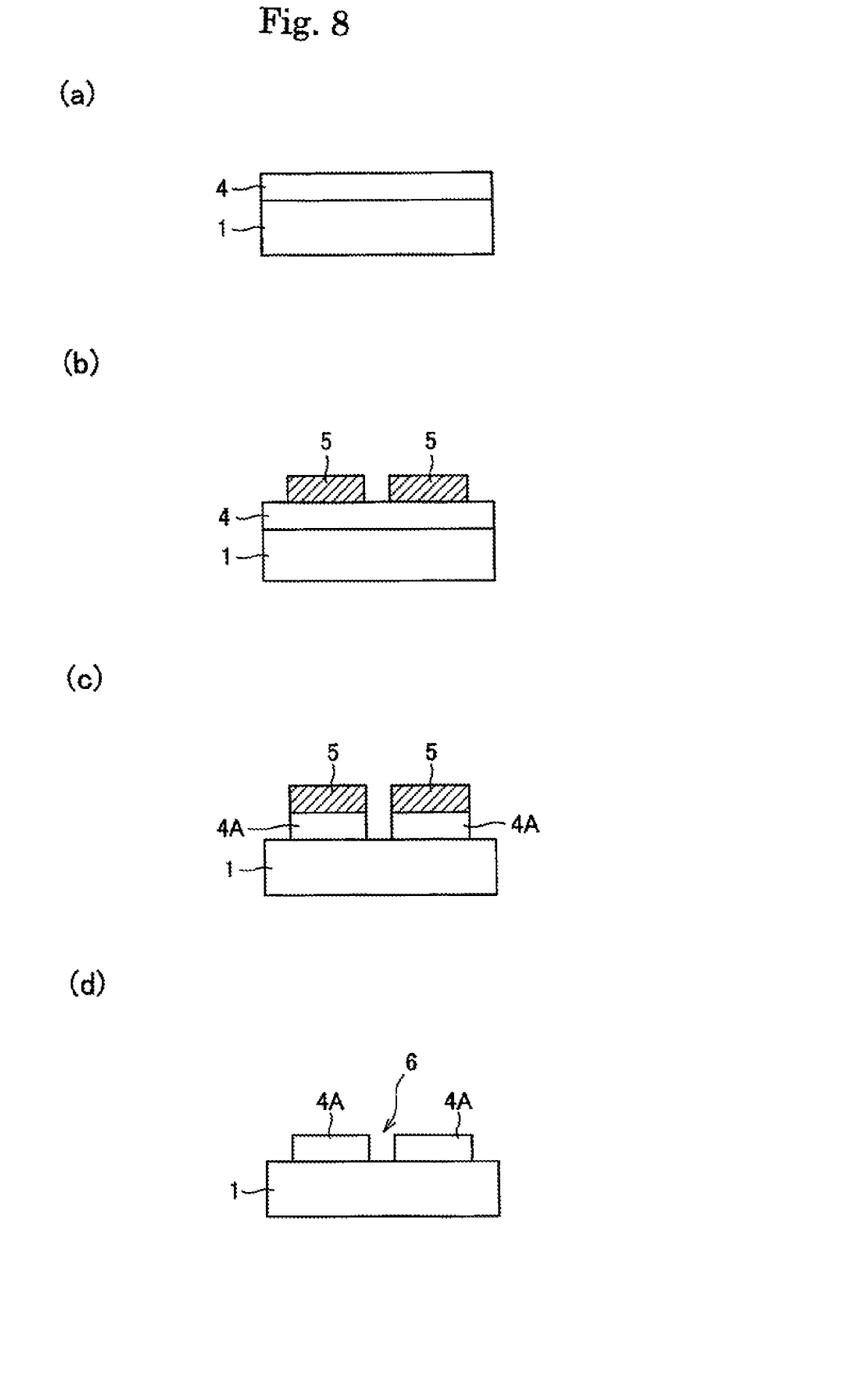
FIGS. 8(a) to 8(d) are views schematically showing process steps of producing a seed crystal substrate according to a comparative example.

Gallium nitride single crystal was grown according to the method described referring to FIG. 8.

Specifically, as shown in FIG. 8(a), a seed crystal layer 4 made of gallium nitride single crystal was epitaxially grown by MOCVD method on a surface of a c-face sapphire body 1 having a diameter of 3 inches. In a central region of φ54 mm of the GaN template, it was formed a mask layer 5 of SiO$_2$ having a shape of stripes each having a width of 0.05 mm and a period of 0.55 mm using photolithography. At this time, the direction of the stripe was made parallel with the direction of m-axis of the gallium nitride single crystal 4. The gallium nitride single crystal layer was etched by using ICP-RIE system and gas mixture of chlorine and boron trichloride until the underlying sapphire was exposed. The SiO$_2$ mask layer 5 was removed using buffered fluoric acid and washing with pure water was performed.

In the thus produced seed crystal substrate, a seed crystal layer 4A with a width of 50 μm was formed in the inner region with a diameter of 54 mm of the seed crystal substrate of φ3 inches, and sapphire was exposed in the other region.

The gallium nitride crystal plate was produced according to the same procedure as the Example 1.

The thus obtained gallium nitride crystal plate was grown over about 20 percent of the region of φ54 mm in the center of the seed crystal substrate, and had a thickness of about 1.5 mm. Further, it was not peeled off from the sapphire body over the whole surface and cracks were observed in the gallium nitride plate. The dislocation density was $10^4/cm^2$ or lower over the whole surface. The rate of the growth over the whole surface was 10 percent, rate of crack-free was 30 percent, and the yield of collection of the gallium nitride crystal plate was 3 percent, according to the similar experiment.

Comparative Example 2

Gallium nitride single crystal was grown according to the process described in FIG. 1 of Japanese Patent No. 4,422,473B.

Specifically, a seed crystal layer made of gallium nitride was epitaxially grown by MOCVD method on a surface of a c-face sapphire body 1 having a diameter of 3 inches. In a central region of φ54 mm of the GaN template, they were formed resist patterns each having a stripe shape each having a width of 3 μm at a distance of 12 μm by photolithography. At this time, the direction of the stripe was made parallel with the direction of m-axis of the gallium nitride single crystal layer.

These resist patterns were then used as masks so that the gallium nitride single crystal layer was subjected to dry etching. It was thereby formed, in the region of φ54 mm in the center of the GaN template and in an upper side of the gallium nitride single crystal layer, stripe patterns including protrusions each having a cross sectional width of about 3 μm and recesses each having a cross sectional width of about 12 μm.

Next, electronic cyclotron resonance sputtering method was used to deposit a thin layer of silicon nitride. Then, the resist patterns of stripe shape were lift off so that the c-face of the gallium nitride single crystal layer was exposed to the upper surface of the protrusion and the thin layer of silicon nitride was deposited in the recess.

Then, the gallium nitride single crystal layer exposed on the upper surface of the protrusion was used as a seed crystal to form a layer of gallium nitride single crystal layer by MOCVD, so that a seed crystal substrate including spaces therein was produced.

The gallium nitride crystal plate was produced according to the same procedure as the Example 1.

The thus obtained gallium nitride crystal plate was grown over the whole surface on the region of φ54 mm in the center of the seed crystal substrate, and had a thickness of about 1.5 mm. Further, it was peeled off in the vicinity of the spaces within the seed crystal substrate, and cracks were observed in the gallium nitride crystal plate. The dislocation density was on the order of $10^5/cm^2$ over the whole surface. The rate of the growth over the whole surface was 100 percent, rate of crack-free was 30 percent, and the yield of collection of the gallium nitride crystal plate was 30 percent, according to the similar experiment.

Comparative Example 3

Figure 9:
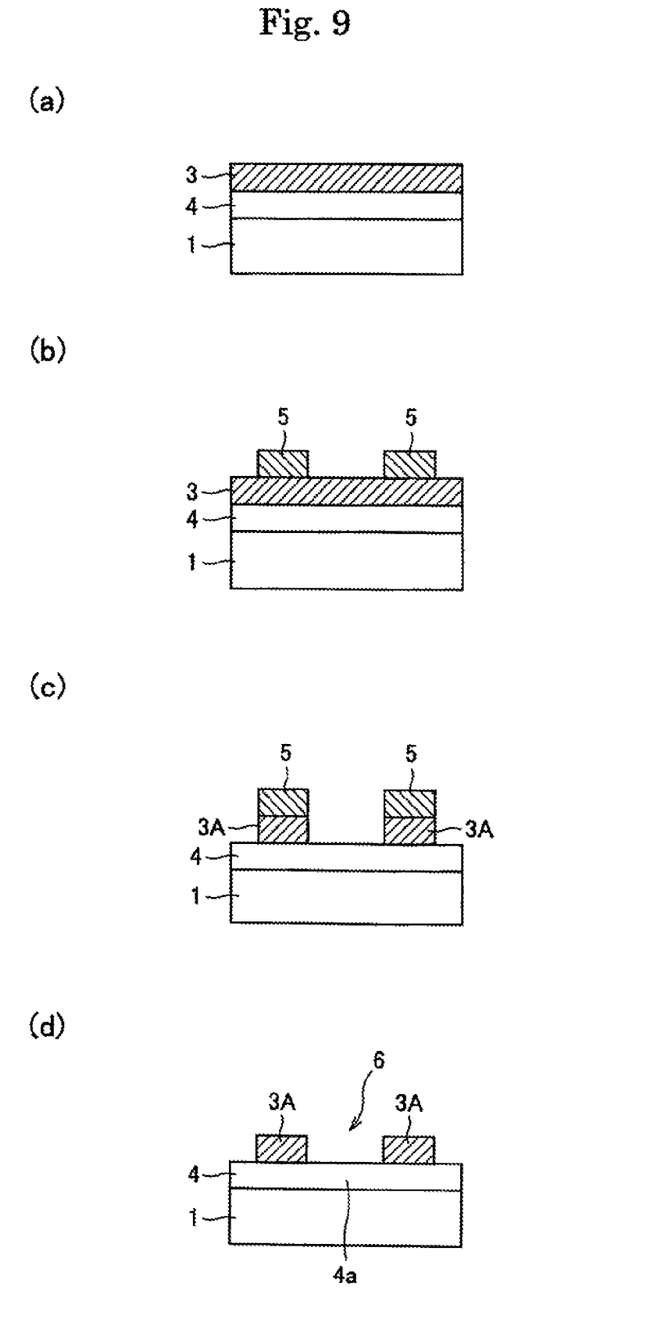
FIGS. 9(a) to 9(d) are views schematically showing process steps of producing a seed crystal substrate according to another comparative example.

Gallium nitride single crystal was grown according to the process described referring to FIG. 9.

Specifically, a gallium nitride single crystal layer 4 and a seed crystal layer 3 made of AlN single crystal were epitaxially grown by MOCVD method on a surface of a c-face sapphire body 1 having a diameter of 3 inches. Then, the whole surface of the multi-layered template was covered with a resist using photolithography and, in a central region of φ54 mm of the template, it was formed resist patterns 5 each having a stripe shape with a width of 500 μm, and non-resist and uncovered parts are provided between the adjacent resist patterns 5. The adjacent resist patterns are provided at a distance of 50 µm. At this time, the direction of the stripe was made parallel with the direction of m-axis of the gallium nitride single crystal layer.

The resist pattern 5 was then used as a mask so that the AlN seed crystal layer 3 was subjected to dry etching until the gallium nitride single crystal layer was exposed. The resist pattern mask was then removed to produce a seed crystal substrate (FIG. 9(*d*)). In the seed crystal substrate, in the region of φ54 mm in the center of the multi-layered template, there was exposed portions 4*a* each having a stripe shape of a width of about 50 µm and of gallium nitride single crystal. The other region was the seed crystal layer 3A of AlN single crystal.

The gallium nitride crystal plate was produced according to the same procedure as the Example 1.

The thus obtained gallium nitride crystal plate was grown over the whole surface in the region of φ54 mm in the center of the seed crystal substrate, and had a thickness of about 1.5 mm. Further, it was not peeled off from the seed crystal substrate and cracks were observed. The dislocation density was on the order of $10^5/cm^2$ over the whole surface. The rate of the growth over the whole surface was 100 percent, rate of crack-free was 0 percent, and the yield of collection of the gallium nitride crystal plate was 0 percent, according to the similar experiment.

Comparative Example 4

Figure 10:
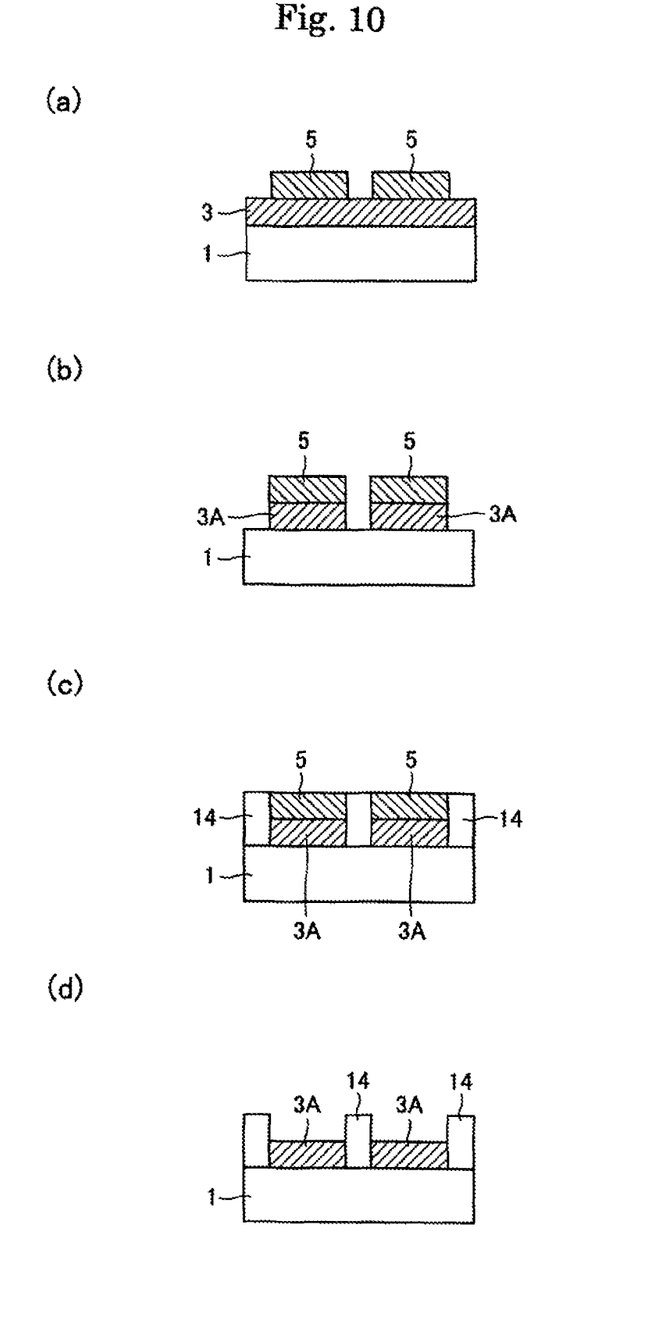
FIGS. 10(a) to 10(d) are views schematically showing process steps of producing a seed crystal substrate according to still another comparative example.

Gallium nitride single crystal was grown according to the process described referring to FIG. 10.

Specifically, a seed crystal layer 3 made of AlN single crystal was epitaxially grown by MOCVD method on a surface of a c-face sapphire body 1 having a diameter of 3 inches. Then, the whole surface of the AlN template was covered with a resist using photolithography and, in a central region of φ54 mm of the AlN template, it was formed a resist pattern 5 including non-resist and uncovered parts each having a stripe shape with a width of 50 µm at a distance of 500 µm. At this time, the direction of the stripe was made parallel with the direction of m-axis of the gallium nitride single crystal layer. The resist pattern was then used as a mask so that the AlN seed crystal layer was subjected to dry etching until sapphire was exposed. A seed crystal layer 14 of gallium nitride single crystal was epitaxially grown on the exposed portion of sapphire by MOCVD. The resist pattern was then removed to produce a seed crystal substrate, in which, in the region of φ54 mm in the center of the AlN template, there was exposed portions 3A each having a stripe shape of a width of about 50 µm of gallium nitride single crystal layer, and the other region was the AlN single crystal layer 14.

The gallium nitride crystal plate was produced according to the same procedure as the Example 1.

The thus obtained gallium nitride crystal plate was grown over the whole surface of the region of φ54 mm in the center of the seed crystal substrate, and had a thickness of about 1.5 mm. Further, it was peeled off from the seed crystal substrate and cracks were observed. The dislocation density was on the order of $10^5/cm^2$ over the whole surface. The rate of the growth over the whole surface was 100 percent, rate of crack-free was 0 percent, and the yield of collection of the gallium nitride crystal plate was 0 percent, according to the similar experiment.

Table 1 summarizes the results of the inventive and comparative examples.

TABLE 1

| | Rate of Growth over whole surface (%) | Rate of Crack-free (%) | Dislocation Density | Yield of collection of crystal (%) |
|---|---|---|---|---|
| Example 1 | 100 | 95 | $<10^4/cm^2$ | 95 |
| Example 2 | 100 | 95 | $<10^4/cm^2$ | 95 |
| Example 3 | 95 | 95 | $<10^4/cm^2$ | 90 |
| Example 4 | 95 | 95 | $<10^4/cm^2$ | 90 |
| Com. Example 1 | 10 | 30 | $<10^4/cm^2$ | 3 |
| Com. Example 2 | 100 | 30 | Order of $10^5/cm^2$ | 30 |
| Com. Example 3 | 100 | 0 | Order of $10^5/cm^2$ | 0 |
| Com. Example 4 | 100 | 0 | Order of $10^5/cm^2$ | 0 |

Although the present invention has been described with reference to particular embodiments, the invention is not limited thereto and various changes and modification may be made without departing from the scope of the appended claims.

The invention claimed is:

1. A method of producing a gallium nitride layer using a seed crystal substrate by flux method,
   wherein said seed crystal substrate comprises a supporting body, a plurality of seed crystal layers each comprising gallium nitride single crystal and separated from one another, a low temperature buffer layer provided between said seed crystal layers and said supporting body and comprising a nitride of a group III metal element, and an exposed layer exposed to spaces between said adjacent seed crystal layers and comprising aluminum nitride single crystal or aluminum gallium nitride single crystal, the method comprising the step of;
   growing said gallium nitride layer on said seed crystal layers by flux method.

2. The method of claim 1, further comprising an intermediate layer on said low temperature buffer layer, said intermediate layer comprising aluminum nitride single crystal or aluminum gallium nitride single crystal.

3. The method of claim 2, further comprising a gallium nitride single crystal layer between said intermediate layer and said low temperature buffer layer.

4. The method of claim 1, wherein said low temperature buffer layer comprises a plurality of separated parts, wherein spaces between said adjacent separated parts are communicated with said spaces between said seed crystal layers, respectively, and wherein said exposed layer is formed on a surface of said supporting body.

5. The method of claim 1, wherein said low temperature buffer layer comprises a plurality of separated parts, wherein spaces between said adjacent separated parts are communicated with said spaces between said seed crystal layers, respectively, and wherein said exposed layer is formed by surface nitridization treatment of said supporting body.

6. The method of claim 1, further comprising a layer of aluminum nitride single crystal or aluminum gallium nitride single crystal and provided between said low temperature buffer layer and said supporting body, wherein said low temperature buffer layer is separated into a plurality of separated parts, wherein spaces between said adjacent separated parts are communicated with said spaces between said seed crystal layers, respectively, and wherein said layer of aluminum nitride single crystal or aluminum gallium nitride single crystal is exposed to said spaces to provide said exposed layer.

7. A seed crystal substrate for growing a gallium nitride layer by flux method, said seed crystal substrate comprising:
- a supporting body;
- a plurality of seed crystal layers each comprising gallium nitride single crystal and separated from one another;
- a low temperature buffer layer provided between said seed crystal layers and said supporting body and comprising a nitride of a group III metal element; and
- an exposed layer exposed to spaces between said adjacent seed crystal layers and comprising aluminum nitride single crystal or aluminum gallium nitride single crystal.

8. The seed crystal substrate of claim 7, further comprising an intermediate layer on said low temperature buffer layer and comprising aluminum nitride single crystal or aluminum gallium nitride single crystal, said intermediate layer comprising said exposed layer.

9. The seed crystal substrate of claim 8, further comprising a gallium nitride single crystal layer between said intermediate layer and said low temperature buffer layer.

10. The seed crystal substrate of claim 7, wherein said low temperature buffer layer comprises a plurality of separated parts, wherein spaces between said adjacent separated parts are communicated with said spaces between said seed crystal layers, respectively, and wherein said exposed layer is formed on a surface of said supporting body.

11. The seed crystal substrate of claim 7, wherein said low temperature buffer layer comprises a plurality of separated parts, wherein spaces between said adjacent separated parts are communicated with said spaces between said seed crystal layers, respectively, and wherein said exposed layer is formed by surface nitridization treatment of said supporting body.

12. The seed crystal substrate of claim 7, further comprising a layer of aluminum nitride single crystal or aluminum gallium nitride single crystal and provided between said low temperature buffer layer and said supporting body, wherein said low temperature buffer layer is separated into a plurality of separated parts, wherein spaces between said adjacent separated parts are communicated with said spaces between said seed crystal layers, respectively, and wherein said layer of aluminum nitride single crystal or aluminum gallium nitride single crystal is exposed to said spaces to provide said exposed layer.

* * * * *